United States Patent
Hoheisel et al.

(10) Patent No.: US 11,870,390 B2
(45) Date of Patent: Jan. 9, 2024

(54) RECEIVER FOR FREE-SPACE OPTICAL POWER BEAMING

(71) Applicants: Raymond Hoheisel, Arlington, VA (US); Andreas Heller, Stuttgart (DE)

(72) Inventors: Raymond Hoheisel, Arlington, VA (US); Andreas Heller, Stuttgart (DE)

(*) Notice: Subject to any disclaimer, the term of this patent is extended or adjusted under 35 U.S.C. 154(b) by 0 days.

(21) Appl. No.: 17/588,762

(22) Filed: Jan. 31, 2022

(65) Prior Publication Data
US 2022/0247348 A1 Aug. 4, 2022

Related U.S. Application Data

(60) Provisional application No. 63/144,699, filed on Feb. 2, 2021.

(51) Int. Cl.
| | |
|---|---|
| *H01L 31/042* | (2014.01) |
| *H02S 10/00* | (2014.01) |
| *H02S 40/20* | (2014.01) |
| *H02S 40/42* | (2014.01) |
| *H02S 40/22* | (2014.01) |
| *H02J 50/30* | (2016.01) |
| *G02B 5/10* | (2006.01) |
| *H02S 30/00* | (2014.01) |

(52) U.S. Cl.
CPC .............. *H02S 40/22* (2014.12); *G02B 5/10* (2013.01); *H02J 50/30* (2016.02); *H02S 30/00* (2013.01)

(58) Field of Classification Search
CPC ......... H02J 50/30; H02J 7/35; H01L 31/0543; H01L 31/0547
See application file for complete search history.

(56) References Cited

U.S. PATENT DOCUMENTS

| | | | |
|---|---|---|---|
| 4,023,368 A | 5/1977 | Kelly | |
| 4,643,545 A | 2/1987 | Vanderwall | |
| 5,714,773 A | 2/1998 | Burrows et al. | |
| 10,825,944 B2 | 11/2020 | Kare et al. | |
| 2008/0017239 A1* | 1/2008 | Tillotson | H01L 31/0232 136/246 |

(Continued)

FOREIGN PATENT DOCUMENTS

| | | |
|---|---|---|
| WO | 2010059873 A2 | 5/2010 |
| WO | 2021/126927 A1 | 6/2021 |

*Primary Examiner* — Angelo Trivisonno

(74) *Attorney, Agent, or Firm* — Banner & Witcoff, Ltd.

(57) ABSTRACT

A free-space optical power beaming device may be configured to receive a light beam from an external source. The device may include a plurality of photovoltaic elements configured to convert light to electrical energy; a plurality of electrical charge storage elements, and a light reflector element configured to reflect a light beam toward one or more of the plurality of photovoltaic elements. Each electrical charge storage element may be coupled with at least of one of the plurality of photovoltaic elements and configured to store electrical energy output from the at least one of the plurality of photovoltaic elements. In some aspects a set of the plurality of photovoltaic elements may be configured in a tilted manner. In other aspects the light reflector element may be steerable to reflect a light beam toward one or more of the plurality of photovoltaic elements to provide a desired time-averaged light intensity distribution.

10 Claims, 11 Drawing Sheets

(56) References Cited

U.S. PATENT DOCUMENTS

| | | | |
|---|---|---|---|
| 2011/0114180 A1* | 5/2011 | Steinblatt | F24S 30/20 |
| | | | 136/259 |
| 2014/0318620 A1* | 10/2014 | Kare | H01L 31/0547 |
| | | | 136/259 |
| 2018/0054159 A1* | 2/2018 | Ahdoot | H02S 40/22 |
| 2019/0019912 A1* | 1/2019 | Nugent, Jr. | H01L 31/0547 |

* cited by examiner

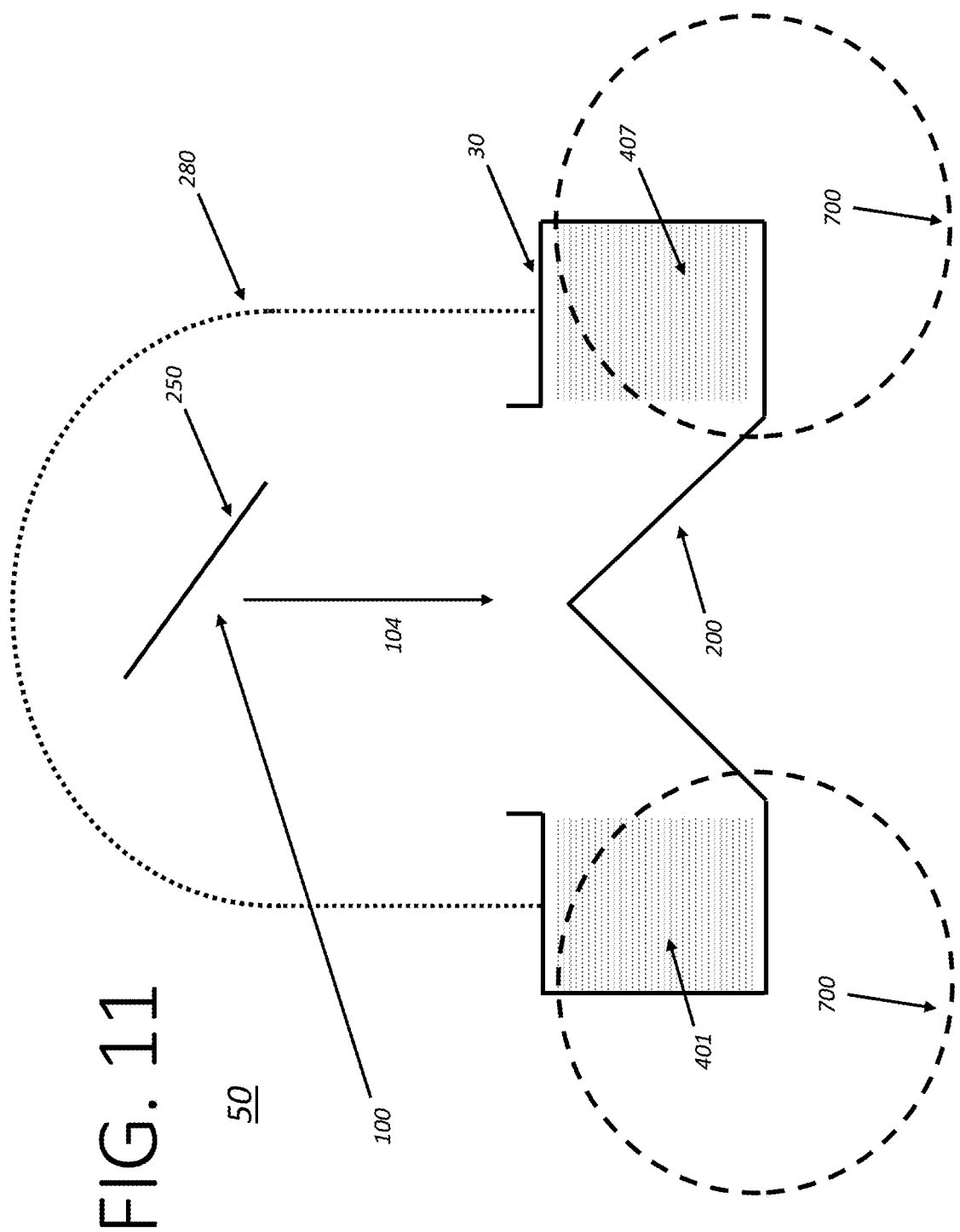

RECEIVER FOR FREE-SPACE OPTICAL POWER BEAMING

CROSS REFERENCE TO RELATED APPLICATIONS

This application claims priority to U.S. provisional application Patent Application Ser. No. 63/144,699, filed Feb. 2, 2021, the contents of which are expressly incorporated herein by reference in their entirety for all purposes.

FIELD

Aspects described herein generally relate to the fields of optical energy conversion and laser-based optical power beaming. More specifically, aspects described herein provide a receiver for free-space optical power beaming using a photovoltaic element, a reflector, control electronics, and a housing.

BACKGROUND

The optical conversion efficiency of photovoltaics has routinely been reported to be above 50% when illuminated by a laser having a wavelength closely matched to the bandgap energy of a photovoltaic element. The high conversion efficiency makes it attractive to use a laser as a transmitter and a photovoltaic element as a receiver to transfer electrical energy between two locations, often also referred to as laser power beaming. This holds in particular for applications where electrical energy has to be transferred between locations (a) ad-hoc, (b) without the usage of electrical wires, (c) without radio-frequency signatures or interference, (d) with low probability of intercept, and (e) over distances of up to several kilometers.

Commercially off-the-shelf high-power lasers in the 1-micrometer wavelength range are available with near-diffraction limited performance and are well suited to illuminate a photovoltaic element over long distances of several kilometers. Without considering atmospheric effects, such as in space or in vacuum, the intensity profile of the laser beam at the location of the photovoltaic-based receiver can generally be described by a quasi-Gaussian/Airy distribution. Under the influence of atmospheric turbulence, however, beam distortion effects such as lensing, scintillation, or beam wander may occur which can lead to significant spatial and temporal modifications of the intensity distribution of the laser beam at the location of the receiver. Spatial modifications of the intensity distribution can cause the intensity at any one spot on the photovoltaic-based receiver to easily be a magnitude higher or lower than it would be without the presence of atmospheric turbulence. On a temporal scale these fluctuations can occur at frequencies of less and more than 100 Hz.

The spatial and temporal fluctuation of the laser beam intensity usually poses significant challenges to the design of the photovoltaic-based free-space optical power beaming receiver device. Aspects described herein may address these and other problems, and generally improve the reliability, efficiency, and cost of laser power beaming systems.

SUMMARY

The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below.

Aspects described herein may overcome certain current challenges of the design of a photovoltaic-based laser power beaming receiver and provide a solution that allows incoming laser beams characterized by spatial and temporal intensity fluctuations to be reliably converted into electrical power.

Aspects described herein may include a photovoltaic element, an optical reflector, a housing, electrical connecting wires, electrical charge storage elements and control electronics. Other aspects herein may include optical elements, such as windows, lenses, diffusers, or reflective surfaces. Other aspects herein may include mechanical elements, such as heatsinks, ventilation openings, or actuators.

According to certain aspects of the disclosure a free-space optical power beaming device is configured to receive a light beam from an external source. In some aspects, the device includes a plurality of photovoltaic elements configured to convert light to energy; a plurality of electrical charge storage elements, each electrical charge storage element coupled with at least of one of the plurality of photovoltaic elements and configured to store energy output from the at least one of the plurality of photovoltaic elements; and a light reflector element configured to reflect a light beam toward one or more of the plurality of photovoltaic elements. In certain other aspects a set of the plurality of photovoltaic elements is configured in a tilted manner where a vector normal to a light receiving surface of the set of the plurality of photovoltaic elements is substantially not directed toward the center of the light reflector element.

In further aspects the light reflector element may be steerable and configured to reflect a light beam toward one or more of the plurality of photovoltaic elements to provide a desired time-averaged light intensity distribution across the plurality of photovoltaic elements. In other aspects the device may include a second light reflector element which may be steerable and configured to direct the light beam from the external source toward the first light reflector element.

Applications in which the free-space optical power beaming receiver according to aspects herein can be applied include, but are not limited to, systems operated in remote locations, electrically powered systems, and systems which require a temporal or permanent external electrical power source. Other applications include systems for which batteries as the only power source impose operational limitations. Typical examples for such applications are: unmanned aerial vehicles, unmanned ground vehicles, unmanned marine vehicles, or remotely operated battery charging systems. Yet other applications include laser power beaming systems which are intended to be operated under exposure to very high intensity laser beams.

Some advantages of a free-space optical power beaming receiver device over previously known systems that may be realized by some aspects of the invention comprise: (a) suitability for very high intensity laser beams, (b) compatibility with photovoltaic devices made of different semiconductors, such as silicon (Si) or III-V materials, (c) tolerance against temporal and spatial fluctuations of the laser intensity distribution, (d) tolerance against laser mis-alignments, such as off-center illumination, (e) capability of providing feedback to the laser system for auto-alignment, (f) small aperture, (g) shock-proof, dust-proof and water-proof design, (h) modular and stackable design for adaption to different intensity levels of the incoming laser beam, and (i) low cost of fabrication.

BRIEF DESCRIPTION OF THE DRAWINGS

The present disclosure is illustrated by way of example and not limited in the accompanying figures in which like reference numerals indicate similar elements and in which:

FIG. 11 illustrates a cross-sectional view of an illustrative free-space optical power beaming receiver attached to a rover according to one or more aspects of the disclosure.

DETAILED DESCRIPTION

Example and illustrative apparatuses, methods and systems are described herein. Any illustrative embodiment or feature described herein is not necessarily to be construed as preferred or advantageous over other embodiments or features. The illustrative embodiments and aspects described herein are not meant to be limiting. It will be readily understood that certain aspects of the disclosed systems and methods can be arranged and combined in a wide variety of different configurations, all of which are contemplated herein.

Furthermore, the particular arrangements shown in the Figures should not be viewed as limiting. It should be understood that other embodiments and/or aspects may include more or less of each element shown in a given Figure. Further, some of the illustrated elements may be combined, split into multiple components/steps, or omitted. Yet further, one or more illustrative embodiments may include elements that are not explicitly illustrated in the Figures.

Aspects described herein provide an apparatus, method, and system for a free-space optical power beaming receiver. The apparatus, method or system may be used in, for example, diverse aerospace, transportation, defense, electrical vehicle charging and environmental monitoring applications.

Aspects and features described herein may combine (a) the electrical energy generation capability of a photovoltaic element, (b) the optical beam directing capability of a reflector, lens, diffuser, and other optical elements which may comprise attached actuators elements, and (c) electrical charge storage elements. An arrangement of photovoltaic elements, optical elements and electrical charge storage elements according to aspects disclosed herein may substantially reduce the impact of atmospheric beam distortion effects on the operation of a laser power beaming receiver and improve overall system efficiency and reliability.

Figure 1:
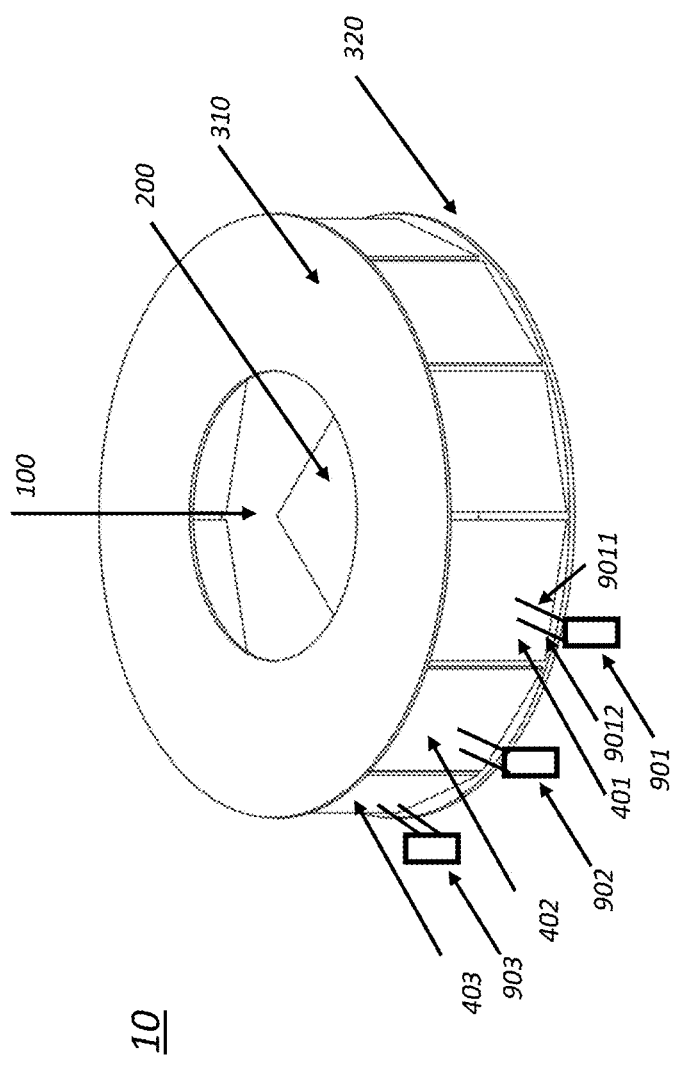
FIG. 1 illustrates a perspective view of an illustrative free-space optical power beaming receiver according to aspects of the disclosure.

FIG. 1 shows an illustrative free-space optical power beaming receiver 10 according to aspects of the disclosure. The receiver 10 may include a housing comprising a lid 310 with an aperture (opening) and a bottom plate 320, a plurality of photovoltaic elements including photovoltaic elements 401, 402, and 403 and others (not labeled), and a reflector 200. Although the receiver 10 employs a plurality of photovoltaic elements, it will be appreciated that the receiver 10 may be configured to have one photovoltaic element 401 on the periphery of the housing between the lid 310 and the bottom plate 320. In some aspects, the photovoltaic elements may be spaced apart from or adjacent to each other around the circumference of the housing between the lid 310 and the bottom plate 320. It will be appreciated that throughout the disclosure instead of a plurality of photovoltaic elements, one photovoltaic element may be employed.

The spatial distribution of the intensity of an incoming light (laser) beam 100 from a laser source (not shown) may be characterized by a quasi-Gaussian/Airy profile, which is familiar to those of ordinary skill in the art, when averaged over time. The incoming light beam (e.g., laser) 100 may be oriented to pass through the aperture in the lid 310 toward the center of the reflector 200. The reflector 200 may have a cone-like shape with a reflective surface oriented to reflect the incoming light beam 100 toward the photovoltaic elements including one or more photovoltaic elements such as photovoltaic elements 401, 402, and 403. In this example, the cone-shape may facilitate the even distribution of the intensity of the incoming light across the surface of the photovoltaic elements. The reflective surface of the reflector 200 may comprise optical patterns, textures or otherwise configured elements, including but not limited to pillows, cylinder optics, or the like, such that an incoming light beam 100 is diffused to create a homogenous light intensity profile across the photovoltaic element(s) and/or such that the photovoltaic element(s) receives a similar level of time-averaged light intensity.

While the reflector 200 illustrated in FIG. 1 is cone-like shaped, it will be appreciated that other shapes may be configured to reflect the incoming light beam and their orientation may vary dependent on the configuration of the one or more photovoltaic elements to realize the desired light intensity profile. The inner side and under side of lid 310 and the bottom plate 320 may be reflective and may also be textured such that the incoming light beam 100 or light reflected by the reflector 200 is reflected and directed toward the photovoltaic element(s) included in the housing. Each photovoltaic element included in the housing may absorb incoming light and convert the incoming light beam into electrical power. The photovoltaic element(s) may be arranged around the reflector 200 in a configuration characterized by an envelope that has a circular, elliptical, rectangular, spherical, cylindrical or otherwise suitable shape. The photovoltaic element(s) may be electrically connected in parallel, in series, independently, or in a combination thereof.

One or more electrical charge storage elements, such as a capacitor, a supercapacitor, a coil, or a battery, may be coupled to the photovoltaic element(s). In the example shown in FIG. 1, the photovoltaic elements 401, 402, 403 are electrically connected to the electrical charge storage elements 901, 902, 903, respectively. Each photovoltaic element may be connected to positive and negative electrical contacts of an electrical charge storage element. For example, in FIG. 1, the electrical charge storage element 901 is electrically connected to the positive and negative electrical contacts of the photovoltaic element 401 by the electrical connectors 9011, 9012. It will be appreciated that each storage element may have its own corresponding electric charge storage element, or plural photovoltaic elements may share an electric charge storage element. An electrical charge storage element may be characterized by a low equivalent series resistance (ESR), and may be connected to the positive and negative electrical contacts of the photovoltaic element(s) such that temporal changes of the intensity of the incoming light beam 100, which may lead to temporal changes of the generated photocurrent, can be balanced by the electrical charge storage element. This balancing may improve the operation and system efficiency of devices connected to the receiver 10 such as maximum power point trackers (MPPT) or power converters.

The photovoltaic element(s) may be arranged around the reflector or a suitable distance from the reflector such that the combined surface area of the photovoltaic element(s) is significantly larger than or comparable to the surface area of the aperture defined by the lid 310. As such, the effective light intensity at the location of the photovoltaic element(s) can be reduced when compared to the initial light intensity spatial distribution at the aperture which may result in the reduction of performance losses associated with device overheating and/or series resistance effects thereby improving the overall system efficiency.

Further, in comparison to the initial light intensity spatial distribution the light intensity profile across the photovoltaic element(s) may be more homogenous due to the diffusing and/or homogenizing effect of the shape and the surface properties of the reflector 200 and the inner parts of the lid 310 and bottom plate 320. The homogenizing effect can result in a more evenly distributed generation of the photocurrent within the photovoltaic element(s) thereby reducing photocurrent mis-match effects. As a result, overall system efficiency may be further increased.

In another illustrative aspect, a second photovoltaic element may be attached to the inner and/or outer side of the bottom plate 320. The second photovoltaic element may be electrically connected in series, in parallel, independently, or in a combination thereof.

In another illustrative aspect, a third photovoltaic element may be attached to the inner and/or outer side of the lid 310. The third photovoltaic element may be electrically connected in series, in parallel, independently, or in a combination thereof.

The photovoltaic element(s) may be made of Silicon (Si), III-V semiconductors, such as InGaAs or GaAs, or a combination thereof. The housing comprised of the lid 310 and the bottom plate 320 may be made of metal, such as aluminum (Al) or the like, a polymer, such as polycarbonate or similar, a foil, such as Mylar®, Kapton® or the like, a glass, such as BK7® or the like, or a combination thereof. The reflector 200 may be made of metal, such as Al, steel or the like, a polymer, such as polycarbonate or the like, a glass, such as BK7® or the like, a combination thereof, and may also be coated with a reflective film, a reflective foil, or an otherwise suitable reflective material. The reflective surface of the reflector 200 may comprise a metal layer or a coating made of gold (Au), silver (Ag), aluminum (Au), or otherwise suitable materials with a high reflectivity in the wavelength range of the incoming light beam 100.

In another illustrative aspect, the free-space optical power beaming receiver 10 may comprise optical sensing elements which are sensitive to the intensity of the incoming light beam 100 and which may be attached to the reflector 200, the bottom plate 320, the photovoltaic element(s) (e.g., photovoltaic element 401) and/or the top lid 310 such that the temporal and spatial intensity profile of the incoming light beam 100 can be measured, characterized, recorded, and/or be made available to a feedback controller, which may include a computing device including a processor that executes instructions stored in memory to provide a control signal to the light (e.g., laser) beam source. The feedback controller can be used, for example, to orient (e.g., adaptively) the light beam 100 toward the center of the free-space optical power beaming receiver 10. The feedback controller can also be used to derive (using techniques known by one skilled in the art) atmospheric parameters, such as turbulence, which can be of importance for system control, risk mitigation, power forecasting, or similar.

Figure 2:
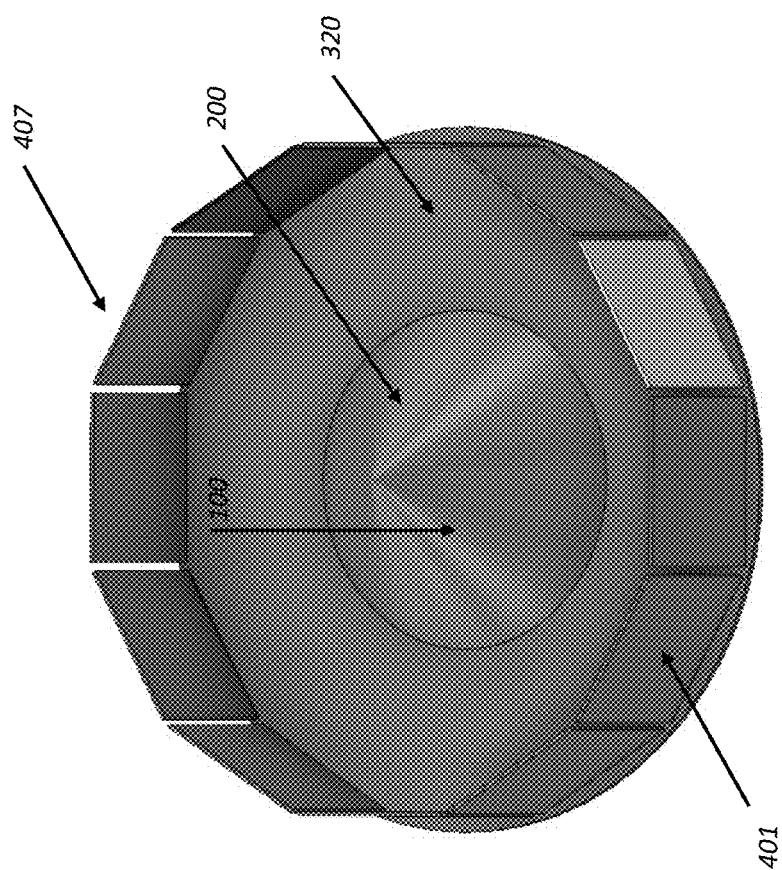
FIG. 2 illustrates a perspective view of the illustrative free-space optical power beaming receiver of FIG. 1 with the lid removed according to aspects of the disclosure.

FIG. 2 shows the free-space optical power beaming receiver of FIG. 1 with the lid 310 removed according to illustrative aspects. The free-space optical power beaming receiver may include one or more photovoltaic elements. FIG. 2 illustrates a free-space optical power beaming receiver 10 including a plurality of photovoltaic elements including photovoltaic elements 401, 407, and others (unlabeled). In the example of FIG. 2, unlike FIG. 1, the incoming light beam (e.g., laser beam) 100 strikes the surface of the reflector 200 at off-centered location as shown. In many instances, the incoming light beam 100, as illustrated in FIG. 2, and its time-averaged intensity distribution may not be centered (off pointed) relative to the location of the reflector 200. The time-averaged intensity of the light reflected toward the photovoltaic element(s) may be different. This may result in different levels of photocurrent or electrical power being generated by the photovoltaic elements. This effect is commonly referred to as a photocurrent mis-match which can often lead to design constraints, and which prevents the connection of photovoltaic elements in series. The connection of photovoltaic elements in series may be beneficial for the reduction of series resistance losses and higher overall system efficiency.

To mitigate photocurrent mis-match, photovoltaic elements such as the photovoltaic elements 401, 407 in FIG. 2 may be arranged on opposite sides of the reflector 200, paired and electrically connected in parallel. In this example, the photocurrents of the paired photovoltaic elements are summed, thereby averaging out relative differences and/or fluctuations of the photocurrents of the individual photovoltaic elements 401, 407 due to the off-center illumination of the incoming light beam 100. Paired photovoltaic elements arranged on opposite sides of the reflector and which are electrically connected in parallel may then have similar levels of combined generated photocurrents when compared to other paired photovoltaic elements. In one aspect, the paired photovoltaic elements would be on geometrically opposite sides, but a slight variation such as paired photovoltaic elements which are on substantially geometrically opposite sides would be acceptable as would be recognized by one of ordinary skill. In such a configuration, usually referred to as a current-matched configuration, the paired photovoltaic elements may then be connected in series to other paired photovoltaic elements. With this configuration, the tolerance against laser mis-alignments, such as off-center illumination and the reduction of photocurrent fluctuations can improve the performance, stability and the conversion efficiency of connected electrical loads and power electronics, including but not limited to maximum power point trackers (MPPT), battery charging equipment, or the like.

Figure 3:
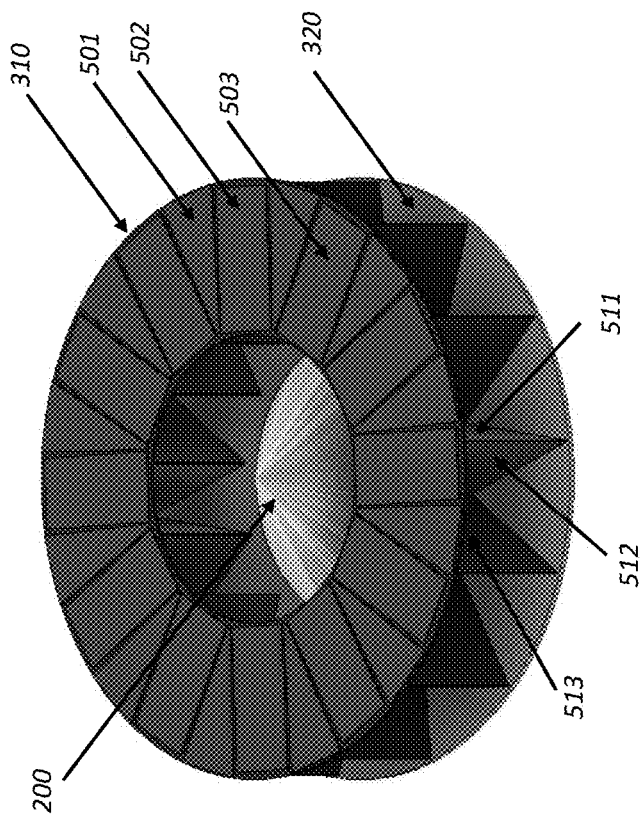
FIG. 3 illustrates a perspective view of another illustrative free-space optical power beaming receiver according to aspects of the disclosure.

FIG. 3 shows another illustrative example of a free-space optical power beaming receiver according to aspects of the disclosure. In this example, a free space optical power beaming receiver 20 comprises a plurality of photovoltaic elements including photovoltaic elements 501, 502, and 503 attached to or forming the outer (top) surface of the lid 310. The plurality of photovoltaic elements attached to or forming the top surface of the lid 310 may be connected to electrical charge storage elements in a similar manner as the plurality of photovoltaic elements illustrated in FIG. 1. By adding additional photovoltaic elements to the free-space optical power beaming receiver 20, incoming laser illumination that is received by the one or more photovoltaic elements 501, 502, 503 can be converted into electrical energy. This can be beneficial for power beaming applications which are characterized by extended beam wander effects, and/or by wider light (e.g., laser) beam diameters than the aperture of lid 310. In addition, the photovoltaic element(s) also convert ambient light into electrical power. The photovoltaic element can have a rectangular, circular, triangular or otherwise suitable shape, or a combination thereof.

In another illustrative aspect, the free-space optical power beaming receiver 20 in FIG. 3 may have one or more photovoltaic elements located between the lid 310 and the bottom plate 320 in a folded or titled configuration in which the photovoltaic element(s) fan in or out from the reflector 200. In the example shown in FIG. 3, a plurality of photovoltaic elements 511, 512, 513 and others (unlabeled) are disposed between the lid 310 and the bottom plate 320 of the free-space optical power beaming receiver 20. The photovoltaic elements 511, 512, 513, and the unlabeled elements may be arranged in a titled or folded configuration where each side of a fold corresponds to one photovoltaic element. For example, the combination of the photovoltaic elements 511 and 512 intersect at a folding point. In one aspect, a single photovoltaic element may be used to form the folded or tilted configuration. Forming a free-space optical power beaming receiver having a single photovoltaic element to be shaped as needed may be more time consuming and costlier than using a plurality of photovoltaic elements.

In such a tilted and/or folded configuration a vector normal to the surface of each photovoltaic element is not substantially directed toward the center of the reflector 200. The total surface area of the photovoltaic element(s) is increased when compared to a configuration in which the normal vector of the surface of the photovoltaic element(s) is substantially pointing toward the center of the reflector 200, such as in FIG. 1. A tilted and/or folded configuration can further reduce the effective intensity incident on each photovoltaic element such that resistive losses can be minimized and overheating effects can be mitigated. This is particularly relevant for laser power beaming applications that are characterized by elevated light (e.g., laser) beam intensities. The tilt angle of the photovoltaic element(s) can be relative to both the horizontal (as illustrated in the FIG. 3 example) and/or vertical axis or a combination thereof. In the example of FIG. 3, the diameter of the aperture (e.g., 0.2 m) is half the diameter of the lid 310 (e.g., 0.4 m).

Figure 4:
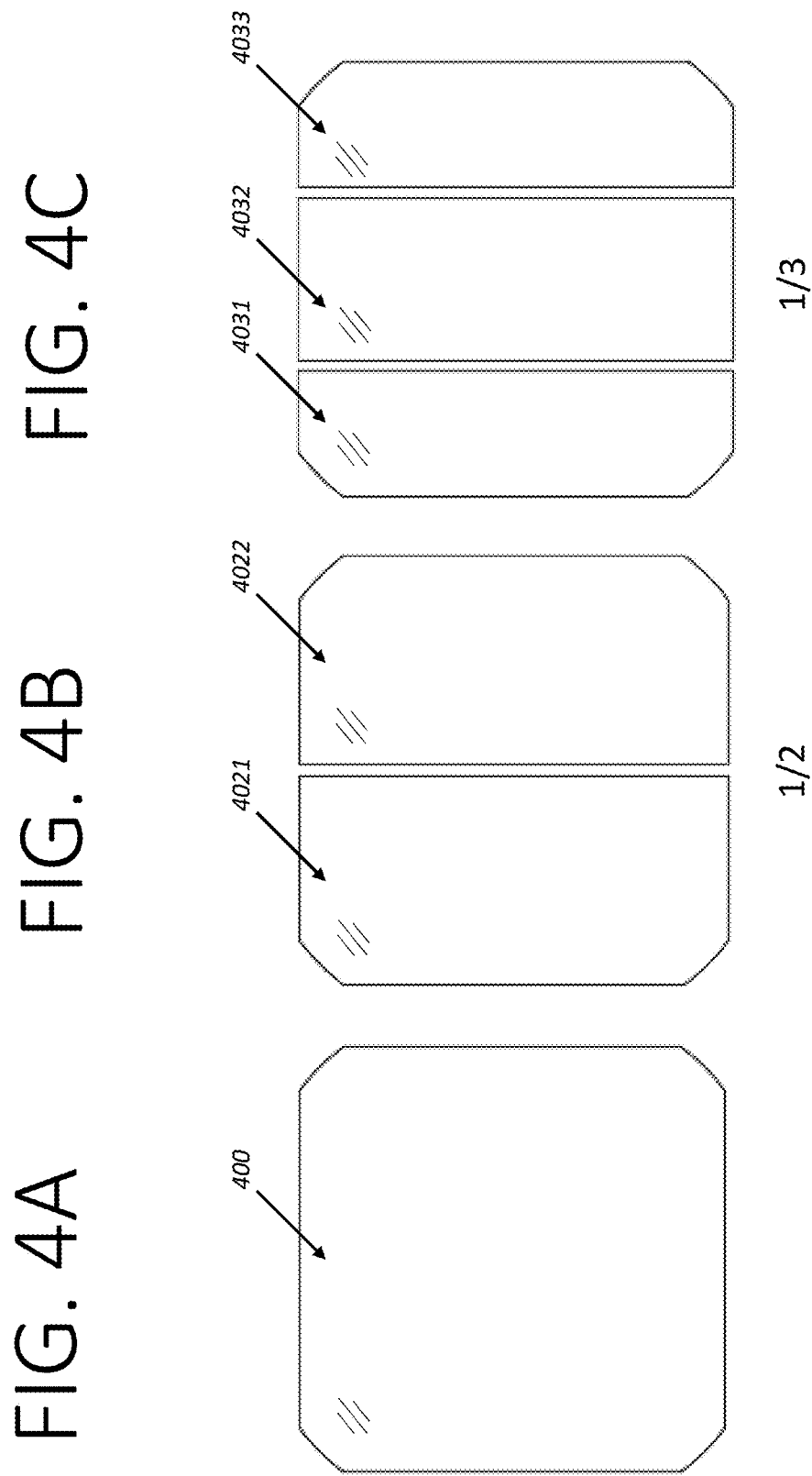
FIGS. 4A-4C illustrate various photovoltaic elements that may be used in an illustrative free-space optical power beaming receiver according to various aspects of the disclosure.

FIGS. 4A-4C illustrate various examples of photovoltaic elements that may be incorporated into a free-space optical power beaming receiver according to various aspects of the disclosure. Each photovoltaic element included in the free-space optical power beaming receiver may be a standalone photovoltaic element 400 as illustrated in FIG. 4A, or alternatively, may be a photovoltaic element sub-divided into sub-photovoltaic elements such as illustrated in FIGS. 4B-4C. For example, FIG. 4B illustrates a photovoltaic element sub-divided into two sub-photovoltaic elements 4021, 4022, which each may be about ½ the initial size of the photovoltaic element before subdivision. Another example in FIG. 4C illustrates a photovoltaic element sub-divided into three sub-photovoltaic elements 4031, 4032, 4033, which each may be about ⅓ of the initial size (though not necessarily the same size as another of the other sub-photovoltaic elements) of the photovoltaic element before subdivision. It will be appreciated that a sub-photovoltaic element may be of any other suitable size.

The sub-photovoltaic elements can be connected in parallel, in series, or in a combination thereof. A photovoltaic element with series connected sub-photovoltaic elements can increase the overall voltage and reduce series resistance effects. This is most relevant at elevated light beam intensities and can result in a significant improvement of the overall system efficiency. To maximize the system efficiency, and to mitigate current mis-match effects, a series connection usually requires sub-photovoltaic elements which generate similar photocurrents. Similar photocurrents in each sub-photovoltaic element can be achieved by a homogenous light intensity profile. A homogenous light intensity profile across a photovoltaic element or sub-photovoltaic element along at least one axis of symmetry can be realized according to certain aspects by adapting the shape and the surface properties of the reflector 200, the bottom plate 320, and the lid 310 according to the intensity distribution of the incoming light beam 100. The sub-photovoltaic elements may be arranged horizontally, vertically, arbitrarily, or in a combination thereof.

The sub-photovoltaic elements may be attached to a holder such as one familiar to those of ordinary skill in the art. The holder may have an even, convex, concave or otherwise suitable surface, and may be made of aluminum (Al), FR4, or the like. The holder may comprise at least one electrical charge storage element, protection diodes, temperature sensors, light intensity sensors, circuit breaker elements, voltage converters, a maximum power point tracker (MPPT), or similar elements.

It will be appreciated by the skilled artisan that a photovoltaic element and/or sub-photovoltaic elements according to aspects may also comprise a lens, a diffusor or an otherwise suitable optical element.

Figure 5:
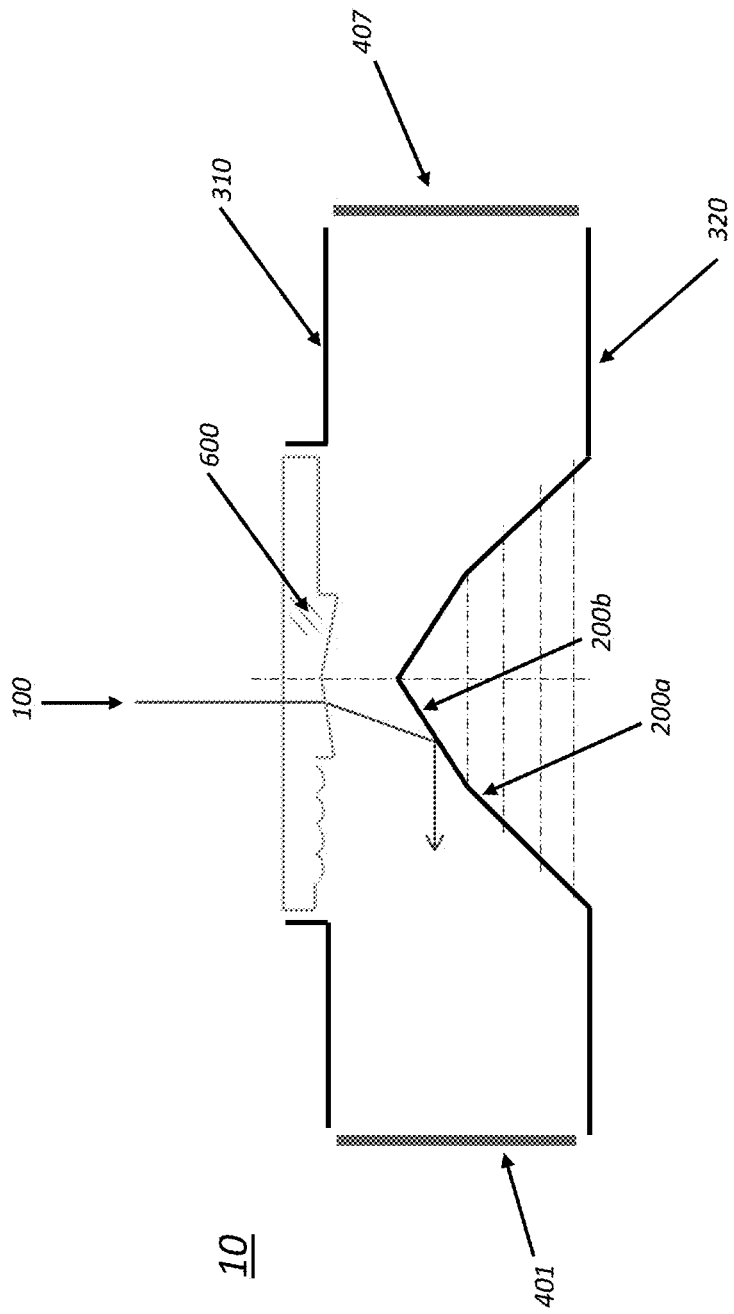
FIG. 5 illustrates a cross-sectional view of a portion of an illustrative free-space optical power beaming receiver according to aspects of the disclosure.

FIG. 5 shows a cross-sectional view of a portion of an illustrative free-space optical power beaming receiver 10 from FIG. 2 according to aspects of the disclosure. In this example, the free-space optical power beaming receiver 10 comprises photovoltaic elements including the photovoltaic elements 401, 407, a first reflector 200a, a second reflector 200b, a bottom plate 320, a lid 310, and an optical element 600. The optical element 600 may be located at the center of the aperture defined by the inner edge of lid 310. The optical element 600 may divert, refract, diffuse, scatter, and/or direct an incoming light beam 100 such that the incoming light beam 100 after reflection by the first reflector 200a and/or the second reflector 200b results in a homogenous distribution of the time-averaged light intensity across the photovoltaic elements 401, 407. The optical element 600 may be a lens with a concave, convex, Fresnel or otherwise suitable shape. The optical element 600 may contain a plurality of sub-lenses or sub-optical elements, such as micro-lenses, pillows, patterns, holes, or the like which may be placed on any refractive or reflective surface according to the desired profile. One skilled in the art would readily be able to select the sub-lenses or sub-optical elements to meet their needs. A person of ordinary skill in art would be able to determine the location at which the optical element 600 may be placed where the intensity of the incoming light beam 100 is highest and where control of the light beam is most critical.

The dimensions of the optical element 600 may be configured to provide a void between the optical element 600 and the lid 310 to allow for circulation of air for cooling or other purposes. The dimensions of the optical element 600 may extend to the edge defined by the upper lid 310 such that the optical element can protect the inner part of the housing against one or more of dust, water, atmospheric shock waves, or the like. The first reflector 200a and the second reflector 200b may have a different shape, inclination angle, and surface properties, and may be arranged such that a homogenous light intensity distribution across the photovoltaic element(s) is created. The optical element 600 may be made of glass, such as BK7® or the like, or a polymer, such as polycarbonate or the like, and may be coated with an anti-reflection-layer.

Figure 6:
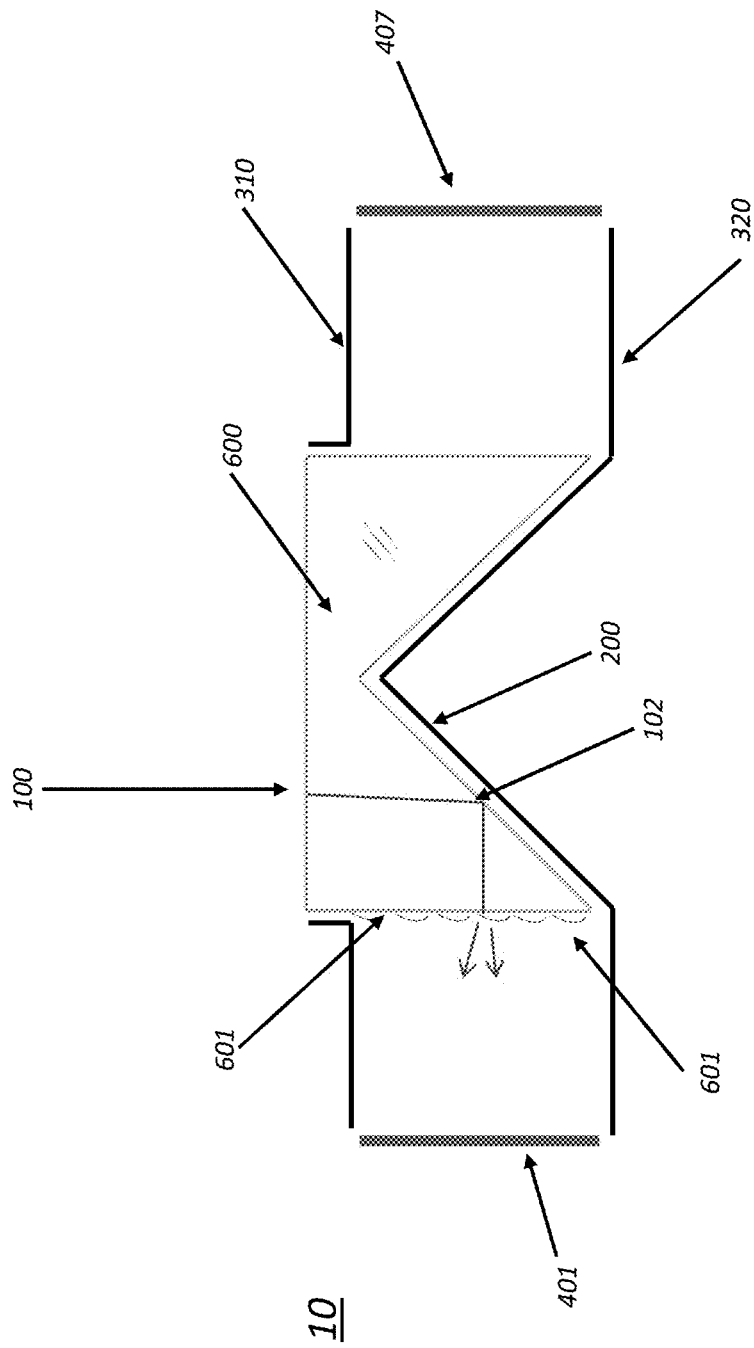
FIG. 6 illustrates a cross-sectional view of a portion of another illustrative free-space optical power beaming receiver according to aspects of the disclosure.

FIG. 6 illustrates a cross-sectional view of an example portion of the illustrative free-space optical power beaming receiver that may be used in the free-space optical power beaming receiver 10 of FIGS. 1 and 2 according to aspects of the disclosure. The free-space optical power beaming receiver 10 comprises, in addition to the elements illustrated in FIGS. 1 and 2, an optical element 600. The optical element 600 may be located at, for example, the center of the aperture defined by the lid 310. The optical element 600 may reflect, divert, refract, diffuse and/or direct an incoming light beam 100 such that the incoming light beam 100 after transmission through the optical element 600 results in a homogenous distribution of the time-averaged light intensity across, for example, the photovoltaic elements 401, 407.

The optical element 600 may reflect the incoming light beam 100 by total internal reflection as illustrated at reflection point 102. Total internal reflection generally results in a minimum of reflection losses and may further increase overall system efficiency. The optical element 600 may also contain a plurality of sub-lenses or sub-optical elements 601, such as micro-lenses, pillows, patterns, holes, or the like which are configured to create a homogenous otherwise desired distribution of the time-averaged light intensity across the photovoltaic element(s). The optical element 600 may only contain a plurality of sub-lenses or sub-optical elements 601.

Figure 7:
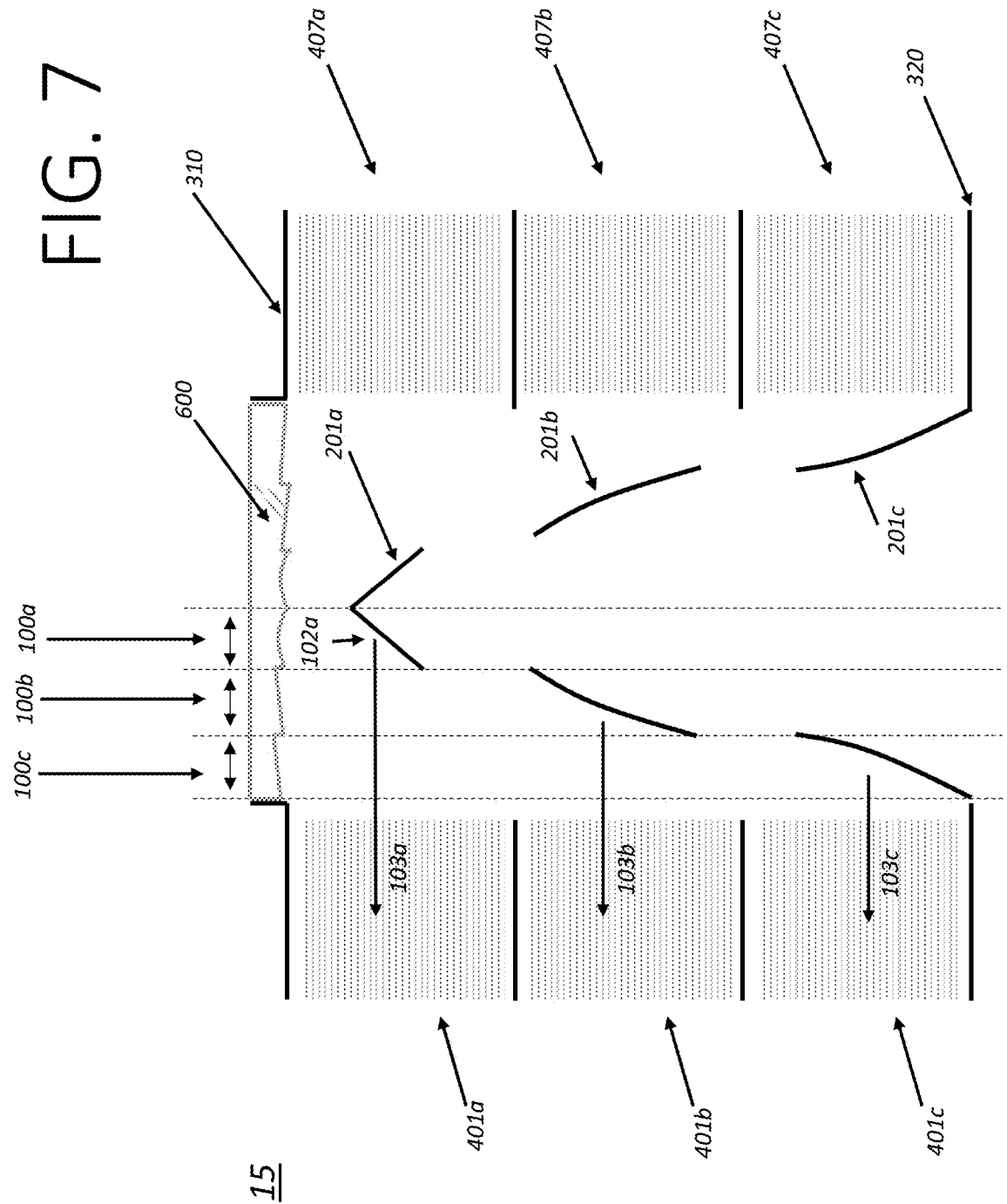
FIG. 7 illustrates a cross-sectional view of a portion of yet another illustrative free-space optical power beaming receiver according to aspects of the disclosure.

FIG. 7 shows a cross-sectional view of a portion of an illustrative alternative free-space optical power beaming receiver 15 according to aspects of the disclosure. The portion of the illustrative alternative free-space optical power beaming receiver 15 can serve as an alternative to the portion illustrated in FIG. 6. In FIG. 7, the portion of the free-space optical power beaming receiver 15 is provided in an illustrative stacked configuration. The illustrative stacked configuration comprises an optical element 600, a lid 310, a bottom plate 320 and a first stack including photovoltaic elements 401a, 407a, and a reflector 201a, and a second stack including photovoltaic elements 401b, 407b, and a reflector 201b. The stacked configuration may, optionally, comprise a third stack containing photovoltaic elements 401c, 407c, and a reflector 201c.

The optical element 600 may reflect, divert, refract, diffuse and/or direct an incoming light beam 100 toward the reflectors 201a, 201b, and 201c, such that sections of the incoming light beam 100a, 100b, 100c, after transmission through the optical element 600 result in a homogenous and/or similar distribution of the time-averaged light intensity across the photovoltaic elements 401a, 407a, 401b, 407b, and 401c, 407c. For example, the reflector 201a may reflect the section of incoming light beam 100a by first surface reflection as illustrated at reflection point 102a in the direction represented by reflected light beam 103a toward the photovoltaic element 401a. Also, the sections of the incoming light beam 100b and 100c are respectively reflected in the directions represented by the reflected light beams 103b and 103c toward the photovoltaic elements 401b, 401c. The dimensions, diameters and effective surface areas of the reflectors 201a, 201b, 201c may be chosen by one of ordinary skill in the art such that the total time-averaged light intensity within the sections 100a, 100b, 100c of the incoming light beam is similar, equal or otherwise distributed.

The number of stacks utilized in a free-space optical power beaming receiver may vary and could be one, two, three, or more. A larger number of stacks may allow for the distribution of the power of the incoming light beam over a larger number of individual stacks. This may result in improved thermal properties, reduced series resistance effects, and a better overall system efficiency. The individual stacks may be fabricated and attached in a modular way, and the number of individual stacks may be chosen according to the intensity level of the light (e.g., laser) beam and the power requirements. The optical element 600 may also contain a plurality of sub-lenses or sub-optical elements, such as micro-lenses, pillows, patterns, holes, or the like which are configured to create a homogenous or otherwise desired intensity distribution across the photovoltaic element(s). The optical element 600 may be omitted or may cover only a portion of the aperture of lid 310. The reflectors 201a, 201b, 201c may have a cone-like shape, a shape with convex or concave surface features or an otherwise suitable shape. In addition, the reflectors 201a, 201b, 201c may operate in total internal reflection or first surface reflection, or a combination thereof.

Figure 8:
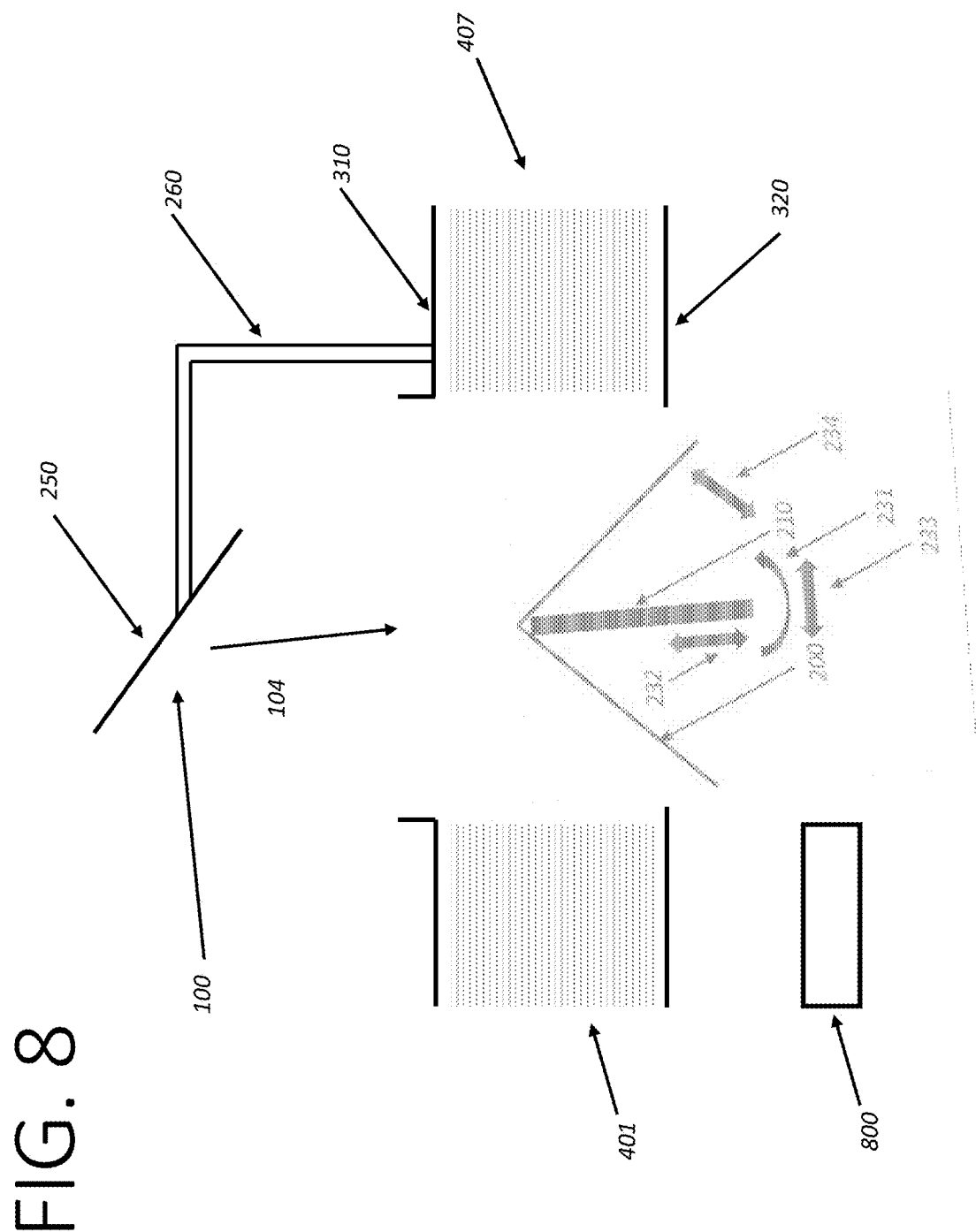
FIG. 8 illustrates a cross-sectional view of a portion of an illustrative free-space optical power beaming receiver including a steerable reflector according to aspects of the disclosure.

FIG. 8 shows a cross-sectional view of a portion of an illustrative free-space optical power beaming receiver including a steerable reflector 250 according to aspects of the disclosure. The illustrative free-space optical power beaming receiver in FIG. 8 includes a plurality of photovoltaic elements including, for example, photovoltaic elements 401, 407, a reflector 200, a steerable reflector 250, a bottom plate 320, a lid 310, and an actuator 210 (e.g., mechanical actuator) attached to the reflector 200.

The mechanical actuator 210 may rotate the reflector 200 in a counterclockwise direction 231 around a first axis orthogonal to the counterclockwise direction, and/or move the reflector 200 along a second axis 232, a third axis 233, or a fourth axis 234 according to illustrative aspects of the disclosure. It will be appreciated that the axes in FIG. 8 are only examples and the mechanical actuator 210 may be moved along other axes relative to the mechanical actuator 210. The reflector 200 may be rotated and/or moved along the various axes to compensate for an incoming light beam 100 that is not orthogonal or quasi-orthogonal to the aperture defined by the aperture of the lid 310.

For an incoming light beam 100 that is orthogonal and/or quasi-orthogonal to the aperture of the lid 310, a rotation of the reflector 200 along a first axis may lead to a homogenous distribution of the time-averaged light intensity across the photovoltaic elements 401, 407.

For an incoming light (e.g., laser) beam that is near parallel with respect to the aperture defined by the lid 310, the steerable reflector 250 may be used to direct the incoming light beam 100 as reflected light beam 104 toward the reflector 200. The steerable reflector 250 may be attached to a holder (e.g., arm) 260 that may be coupled to the top of the lid 310 as illustrated in FIG. 8, to a side between the lid 310 and the bottom surface 320, or to the bottom surface 320. The holder 260 may include a mechanical actuator (not shown) such that the steerable reflector 250 may be rotated around a first axis and/or may be moved along a second, third or fourth axis to allow the incoming light beam 100 to be directed toward the reflector 200. The steerable reflector 250 may have a circular or rectangular shape, a flat, convex and/or concave surface and may be comprised of a mirror, lens or otherwise suitable optical element.

A control unit 800 (e.g., memory and processor(s) for executing instructions stored in the memory) may be configured to control the orientation and/or the rotation of the steerable reflector 250 such that the incoming light beam 100 is directed toward the reflector 200. The control unit 800 may be adapted to calculate the desired orientation and/or rotation of the steerable reflector 250 based on various parameters such as the location of the source from where the light beam 100 is being emitted, and/or the location of the optical power beaming receiver (e.g., the location of reflector 200, the location of the aperture (if included), and/or the intensity of light being received by, for example, the reflector 200 or the photovoltaic elements. The control unit 800 may be included as part of the optical power beaming receiver, and may be in communication with a remote server that provides information such as location of the light source. Alternatively, the control unit 800 may be able to communicate (e.g., wireless) directly with the light source providing the light beam 100.

By rotating and/or moving the reflector 200 and/or the steerable reflector 250, light (e.g., laser) beams that are not quasi-orthogonal to the aperture defined by the lid 310 may be directed toward the photovoltaic elements for electrical power conversion. This increases the angle of acceptance for incoming light beams.

In another illustrative aspect of the optical power beaming receiver of FIG. 8, the reflector 200 may be omitted and the steerable reflector 250 may be rotated and/or moved to direct the reflected light beam 104 toward the photovoltaic elements 401, 407. The photovoltaic elements 401, 407 may be tilted toward the steerable reflector 250.

Figure 9:
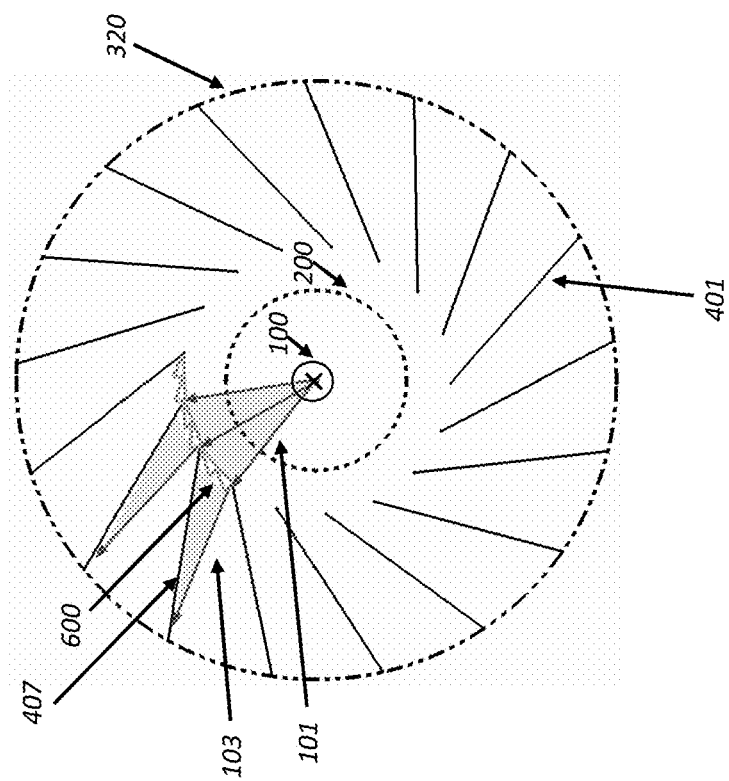
FIG. 9 illustrates a top view of a portion of an illustrative free-space optical power beaming receiver with the lid removed according to aspects of the disclosure.

FIG. 9 shows a top cross-sectional view of a portion of an illustrative free-space optical power beaming receiver 22 with the lid removed having photovoltaic elements arranged in a folded or tilted configuration similar to FIG. 3, but with each photovoltaic element fanned in the same direction, according to various aspects of the disclosure. The free-space optical power beaming receiver 22 includes photovoltaic elements 401, 407, a reflector 200, an incoming light beam 100, at least one optical element 600, and a bottom plate 320. The incoming light beam 100 and its time-averaged intensity distribution may or may not be centered relative to the location of the reflector 200.

Each photovoltaic element such as the photovoltaic elements 401, 407 may be arranged in a tilted and/or folded configuration with quasi-rotational symmetry. The arrangement of the photovoltaic elements in FIG. 9 may allow for an increased air flow within the region between the lid (not shown in FIG. 9) and the bottom plate 320 from outside toward the reflector 200 between the photovoltaic elements for cooling and thermal management purposes. Such configurations may be advantageous for various light power beaming applications at elevated light intensity levels, for example, laser power beaming applications at elevated laser intensity levels.

Referring to FIG. 9, the incoming light beam 100 may be reflected by the reflector 200 in a direction of the reflected light beam 101 toward the at least one optical element 600 from where it is then directed in a direction of the reflected light beam 103 toward at least one photovoltaic element 407. The at least one optical element 600 may be a prism, a lens or an otherwise suitable optical element and may also contain a plurality of sub-lenses or sub-optical elements, such as micro-lenses, pillows, patterns, holes, or the like, which are configured to create a homogenous otherwise desired distribution of the time-averaged light intensity across the at least one photovoltaic element 407. The usage of the at least one optical element 600 is optional and may allow for a larger number of photovoltaic elements per area of the bottom plate 320. This may improve thermal cooling needs. The at least one optical element 600 may be placed onto one or more photovoltaic elements. The at least one optical element 600 may focus, diffuse or otherwise direct the reflected light beam 101.

It will be appreciated that the photovoltaic elements disclosed herein may comprise bifacial solar cells, which would be particularly beneficial in aspects where light is received by both a front and rear surface of the photovoltaic elements such as FIG. 9. As known to one skilled in the art, bifacial solar cells can produce electrical energy when a light beam illuminates either the front or rear surface of the photovoltaic element.

Figure 10:
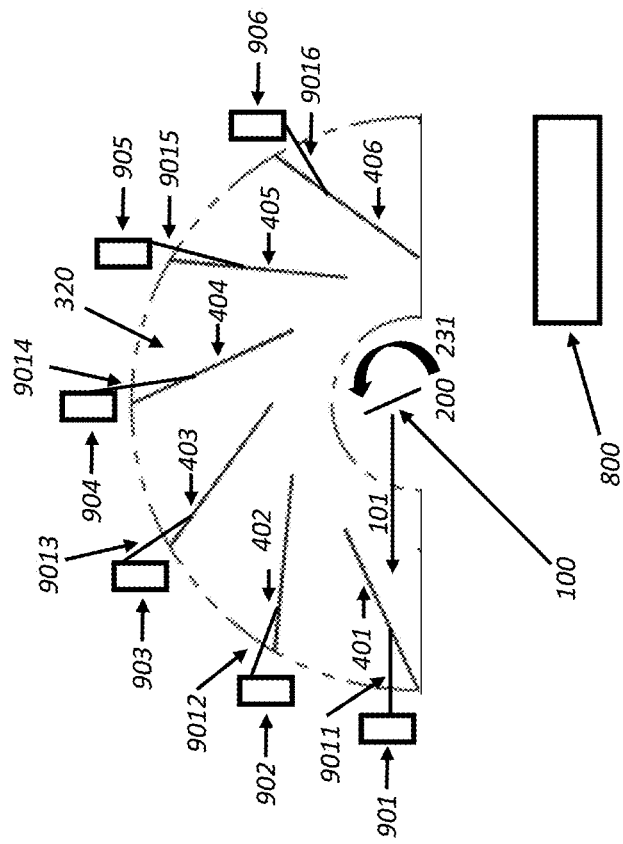
FIG. 10 illustrates a top view of a portion of another illustrative free-space optical power beaming receiver according to aspects of the disclosure.

FIG. 10 shows a top view of a portion of an illustrative free-space optical power beaming receiver according to aspects of the disclosure. The illustrative free-space optical power beaming receiver in FIG. 10 comprises a plurality of photovoltaic elements 401, 402, 403, 404, 405, 406, a reflector 200, which is steerable, a bottom plate 320, electrical charge storage elements 901, 902, 903, 904, 905, 906, electrical connectors 9011, 9012, 9013, 9014, 9015, 9016, and a control unit 800. The electrical charge storage elements 901, 902, 903, 904, 905, 906 are respectively electrically connected to the positive and negative electrical contacts of the photovoltaic elements 401, 402, 403, 404, 405, 406 by the electrical connectors 9011, 9012, 9013, 9014, 9015, 9016. The control unit 800 (e.g., memory and processor(s) for executing instructions stored in the memory) may be configured to control the orientation (angle) and/or the rotation of the reflector 200 such that incoming light beam 100 is reflected by the reflector 200 in a direction of the reflected light beam 101 toward one or more of the photovoltaic elements 401, 402, 403, 404, 405, 406. In the example of FIG. 10, the photovoltaic elements 401, 402, 403, 404, 405, 406 are all titled in the same radial direction, which may be beneficial for cooling, but it will be appreciated that individual photovoltaic elements may be titled in different radial directions.

The reflector 200 may be rotated along at least one axis in a counterclockwise direction 231 and the rotation may be controlled by the control unit 800. The control unit 800 may control the rotation and/or angle of the reflector 200 such that at a first time t1 the reflected light 101 is directed toward a first photovoltaic element 401 until a first electrical charge storage element 901 reaches a desired state of charge. At a second time t2, the control unit 800 may control the rotation and/or angle of the reflector 200 such that the reflected light 101 is directed toward a second photovoltaic element 402 until a second electrical charge storage element 902 reaches a desired state of charge. At a third time t3, the control unit 800 may control the rotation and/or angle of the reflector 200 such that the reflected light 101 is directed toward a different photovoltaic element(s) until a different electrical charge storage element(s) reaches a desired state of charge.

Electrical charge elements which have reached a desired level of charge may be electrically connected to an electrical load in series and/or parallel or a combination thereof. When connected to an electrical load, the state of charge of an electrical charge element may decrease. The control unit 800, after determining that the state of charge decreases in an electrical charge element, by rotating the reflector 200 may then redirect the reflected light 101 to a photovoltaic element that is connected to the electrical charge element such that the electrical charge element can reach a desired level of charge again.

The reflector 200 may comprise a mirror, a lens, a prism, or an otherwise suitable optical element, or a combination thereof. The reflector 200 may be rotated at an angular velocity comparable to 100 rotations per minute (RPM) or less or 10000 RPM or more. The angular velocity of the reflector may vary under the control of a control unit 800 as described. The reflector 200 may be rotated within a confined angular range such that the reflected light beam 101 can be directed toward the one or more photovoltaic elements 401, 402, 403, 404, 405, 406. The rotational axis of the reflector (e.g., mirror) 200 may be parallel to and/or tilted against the normal vector of the bottom plate 320.

FIG. 11 shows a cross-sectional view of an illustrative free-space optical power beaming receiver attached to a rover 50 (e.g., moon rover, space rover) according to aspects of the disclosure. The illustrative free-space optical power beaming receiver 30 may comprise a plurality of photovoltaic elements including photovoltaic elements 401, 407, a reflector 200, a second reflector 250 (which may be attached to the lid 320 by a holder (not shown in FIG. 11; see e.g., FIG. 8)), and a cover 280. The free-space optical power beaming receiver 30 converts the light beam to energy to provide power for operation of the rover 50 including movement and general heating, which may be necessary, for example, when the rover 50 is being used on a celestial body. In this example, an incoming light beam 100 is reflected by the second reflector 250 producing reflected light beam 104, which is directed toward the reflector 200 and ultimately converted to energy by the photovoltaic elements 401, 407 to power rotation of the wheels 700 of the rover 50.

Optionally, a cover 280 may enclose the photovoltaic elements including photovoltaic elements 401, 407, and the reflector 200, and optionally, the second reflector 250 to prevent dust, debris, water, or other contaminants from adversely affecting performance. The cover 280 may be optically transparent for wavelengths in the range of the incoming light beam 100. It will be appreciated that a cover is not required.

One or more aspects discussed herein may be embodied in computer-usable or readable data and/or computer-executable instructions, such as in one or more program modules, executed by one or more computers or other devices as described herein. Generally, program modules include routines, programs, objects, components, data structures, and the like that perform particular tasks or implement particular abstract data types when executed by a processor in a computer or other device. The modules may be written in a source code programming language that is subsequently compiled for execution, or may be written in a scripting language such as (but not limited to) HTML, or XML. The computer executable instructions may be stored on a computer readable medium such as a hard disk, optical disk, removable storage media, solid-state memory, RAM, and the like. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects discussed herein, and such data structures are contemplated within the scope of computer executable instructions and computer-usable data described herein. Various aspects discussed herein may be embodied as a method, a computing device, a system, and/or a computer program product.

The description above describes various features and functions of the disclosed systems, devices, and methods with reference to the accompanying Figures. While various aspects and embodiments have been disclosed herein, other aspects and embodiments will be apparent. For example, features described herein with relationship to certain aspects may be combined with features described with relationship to other aspects. The various aspects and embodiments disclosed herein are for purposes of illustration and are not intended to be limiting with the true scope and spirit being indicated by the following claims.

What is claimed is:

1. A free-space optical power beaming device configured to receive a light beam from an external source, the device comprising:
   a plurality of photovoltaic elements configured to convert light to electrical energy;
   a plurality of electrical charge storage elements, each electrical charge storage element coupled with at least one of the plurality of photovoltaic elements and configured to store electrical energy output from the at least one of the plurality of photovoltaic elements; and
   a light reflector element configured to reflect a light beam toward one or more of the plurality of photovoltaic elements,
   wherein a set of the plurality of photovoltaic elements is configured in a tilted manner in which each of the set of the plurality of photovoltaic elements fan in or out from the light reflector element, and
   wherein a vector normal to a light receiving surface of each photovoltaic element of the set of the plurality of photovoltaic elements is substantially not directed toward the symmetry axis of the light reflector element.

2. The device of claim 1, wherein the light reflector element is configured to direct light toward the plurality of photovoltaic elements by at least one of: surface reflection, total internal reflection, diffraction, and scattering.

3. The device of claim 1, wherein the light reflector element is configured to have characteristics of at least one of: a cone-like shape, and rotational symmetry.

4. The device of claim 1, comprising an optical element configured to direct the light beam toward the light reflector element by at least one of: surface reflection, total internal reflection, diffraction, and scattering.

5. The device of claim 1, wherein each of the plurality of photovoltaic elements is configured in the tilted manner and oriented to be fanned from the light reflector element in the same radial direction.

6. The device of claim 1, wherein the light reflector element is steerable based on a control signal to provide a desired time-averaged light intensity distribution across the plurality of photovoltaic elements.

7. The device of claim 6, further comprising a controller configured to generate the control signal based on at least one of: a charging state of the plurality of electrical charge storage elements, and photocurrent generated by the plurality of the photovoltaic elements.

8. The device of claim 1, wherein the light reflector element comprises a first reflector and a second reflector, and wherein the first reflector is stacked on the second reflector in an orientation causing sections of the light beam, which are routed toward the light reflector element, to provide a homogenous distribution of a time-averaged light intensity across a first one of the plurality of photovoltaic elements and a second one of the plurality of photovoltaic elements.

9. The device of claim 1, further comprising:
a bottom plate; and
a lid with an aperture, the lid comprising a second plurality of photovoltaic elements configured to convert light to energy,
wherein the plurality of photovoltaic elements is disposed between the lid and the bottom plate.

10. The device of claim 1, wherein the plurality of photovoltaic elements includes a first photovoltaic element and a second photovoltaic element paired with each other, electrically connected in parallel, and disposed on opposite sides of the light reflector element from each other.

\* \* \* \* \*